(12) United States Patent
Schultz et al.

(10) Patent No.: US 6,191,613 B1
(45) Date of Patent: Feb. 20, 2001

(54) PROGRAMMABLE LOGIC DEVICE WITH DELAY-LOCKED LOOP

(75) Inventors: David P. Schultz; Lawrence C. Hung, both of San Jose; F. Erich Goetting, Cupertino, all of CA (US)

(73) Assignee: Xilinx, Inc., San Jose, CA (US)

( * ) Notice: Under 35 U.S.C. 154(b), the term of this patent shall be extended for 0 days.

(21) Appl. No.: 09/363,941

(22) Filed: Jul. 29, 1999

(51) Int. Cl.⁷ .................................. H03K 19/177
(52) U.S. Cl. ............................... 326/39; 326/40
(58) Field of Search ...................... 326/37, 38, 39, 326/40

(56) References Cited

U.S. PATENT DOCUMENTS

| | | | |
|---|---|---|---|
| 3,982,190 | 9/1976 | Schaefer | 328/110 |
| 4,929,916 | 5/1990 | Fukada | 331/1 A |
| 5,430,734 | * 7/1995 | Gilson | 326/38 |
| 5,614,855 | 3/1997 | Lee et al. | 327/158 |
| 5,646,564 | 7/1997 | Erickson et al. | 327/158 |
| 5,692,147 | * 11/1997 | Larsen et al. | 326/39 |
| 5,726,584 | * 3/1998 | Freidin | 326/39 |
| 5,744,991 | 4/1998 | Jefferson et al. | 327/158 |
| 5,815,016 | 9/1998 | Erickson | 327/158 |
| 5,825,662 | * 10/1998 | Trimberger | 326/39 |
| 5,914,616 | 6/1999 | Young et al. | 326/41 |
| 6,029,236 | * 2/2000 | Steele et al. | 326/39 |

OTHER PUBLICATIONS

Lucent Technologies, 'Preliminary Data Sheet: ORCA OR3Cxx (5V) and OR3Txxx (3.3V) Series Field Programmable Gate Arrays, Nov. 1997, pp. 45–84.

Xilinx, Inc., "XAPP 132: Using the Virtex Delay–Locked Loop," Oct. 21, 1998. pp. 1–14.

Xilinx, Inc., "XCell:The Quarterly Journal for Programmable Logic Users," First Quarter, 1999.

* cited by examiner

*Primary Examiner*—Trong Phan
(74) *Attorney, Agent, or Firm*—Arthur J. Behiel, Esq.; Edel M. Young

(57) ABSTRACT

A programmable logic device (PLD), such as a field-programmable gate array (FPGA), includes an integrated delay-locked loop that produces a lock signal internal to the FPGA. The FPGA also includes a sequencer and related global signals adapted to configure the FPGA using external configuration data. The sequencer disables the FPGA during the configuration process. The sequencer then continues to disable the fully configured FPGA until receipt of the lock signal. The configuration process, including the establishment of a valid internal clock, is controlled entirely within the FPGA. In one embodiment, an FPGA can be fully or partially reconfigured without powering down the device. The delay-locked loop maintains a lock on the clock signal so that the sequencer need not wait for the lock signal after reconfiguration.

13 Claims, 5 Drawing Sheets

PROGRAMMABLE LOGIC DEVICE WITH DELAY-LOCKED LOOP

FIELD OF THE INVENTION

This invention relates generally to programmable logic devices, and in particular to start-up sequencers for programmable logic devices.

BACKGROUND

Programmable logic devices (PLDS) are a well-known type of digital integrated circuit that may be programmed by a user (e.g., a circuit designer) to perform specified logic functions. PLDs are becoming ever more popular, largely because they are less expensive in relatively small quantities and require less time to implement than semi-custom and custom integrated circuits.

FIG. 1 is a block diagram of one type of PLD, a field-programmable gate array (FPGA) 100. FPGA 100 includes an array of configurable logic blocks (CLBs) 110 that are programmably interconnected to each other and to programmable input/output blocks (IOBs) 120. The interconnections are provided by a complex interconnect matrix represented as horizontal and vertical interconnect lines 130 and 140. This collection of configurable elements and interconnect may be customized by loading configuration data into internal configuration memory cells (not shown) that define how the CLBs, interconnect lines, and IOBs are configured. The configuration data may be read from memory (e.g., an external PROM) or written into FPGA 100 from an external device. The collective program states of the individual memory cells then determine the function of FPGA 100.

CLBs 110 and IOBs 120 additionally include user-accessible memory elements (not shown), the contents of which can be modified as FPGA 100 operates as a logic circuit. These user-accessible memory elements, or "user logic," include block RAM, latches, and flip-flops. The data stored in user logic is alternatively referred to as "user data" or "state data."

The power of FPGA 100 is that its logical function can be changed at will. Such changes are accomplished by loading the configuration memory cells and resetting (or presetting) the user logic. A sequencer (not shown) controls the configuration process and is designed to prevent interconnect contention during configuration.

Modern FPGAs are complex integrated circuits. As integration levels and system complexity increases, the distribution of the system clock becomes more critical, and consequently more difficult. Clock distribution must take into account distribution topography across the circuit, propagation delays in routing the clock signal to all elements on the circuit, desired set-up and hold times, and variation in system design parameters.

Some conventional programmable logic devices address some of the problems of clock distribution by including a delay-locked loop (DLL) on chip. DLLs employ a controlled delay element to null clock distribution delays within the FPGA by comparing the phase of a reference clock signal with that of a feedback signal. The phase difference between the two signals is used to bring the signals into a fixed phase relation. DLLs typically output a "lock" signal once the signals are in a fixed phase relation. The lock signal is necessary to prevent timing errors that might occur in the absence of a stable clock.

Lucent Technologies, Inc., manufactures FPGAs, under the trademark Orca®, that include programmable clock managers (PCMs) capable of functioning as DLLS. A lock signal from the PCM indicates a stable clock in the FPGA. Unfortunately, the lock signal can pulse low before the output clock stabilizes, thereby falsely indicating a stable clock. Lucent thus suggests that the user integrate the lock signal over a time period suitable to the subject application. In other words, this conventional DLL configuration places the onus on the user to ensure that the output of the DLL is stable before relying upon the programmable logic device.

SUMMARY

The present invention is directed to a programmable logic device (PLD) that minimizes the risk of error due to an unstable clock signal. One PLD in accordance with the invention, a field-programmable gate array (FPGA), includes an integrated delay-locked loop that produces a lock signal internal to the FPGA. The FPGA also includes a sequencer and related global signals adapted to configure the FPGA using external data. During the configuration process, the sequencer disables the FPGA until receipt of the lock signal. The configuration process, including the establishment of a valid internal clock, is controlled entirely within the FPGA. Thus, the user is not required to monitor the status of the delay-locked loop.

In one embodiment, an FPGA in accordance with the invention can be fully or partially reconfigured without powering down the device. The delay-locked loop maintains a lock on the clock signal so that the sequencer need not wait for the lock signal after reconfiguration.

DETAILED DESCRIPTION

Figure 1:
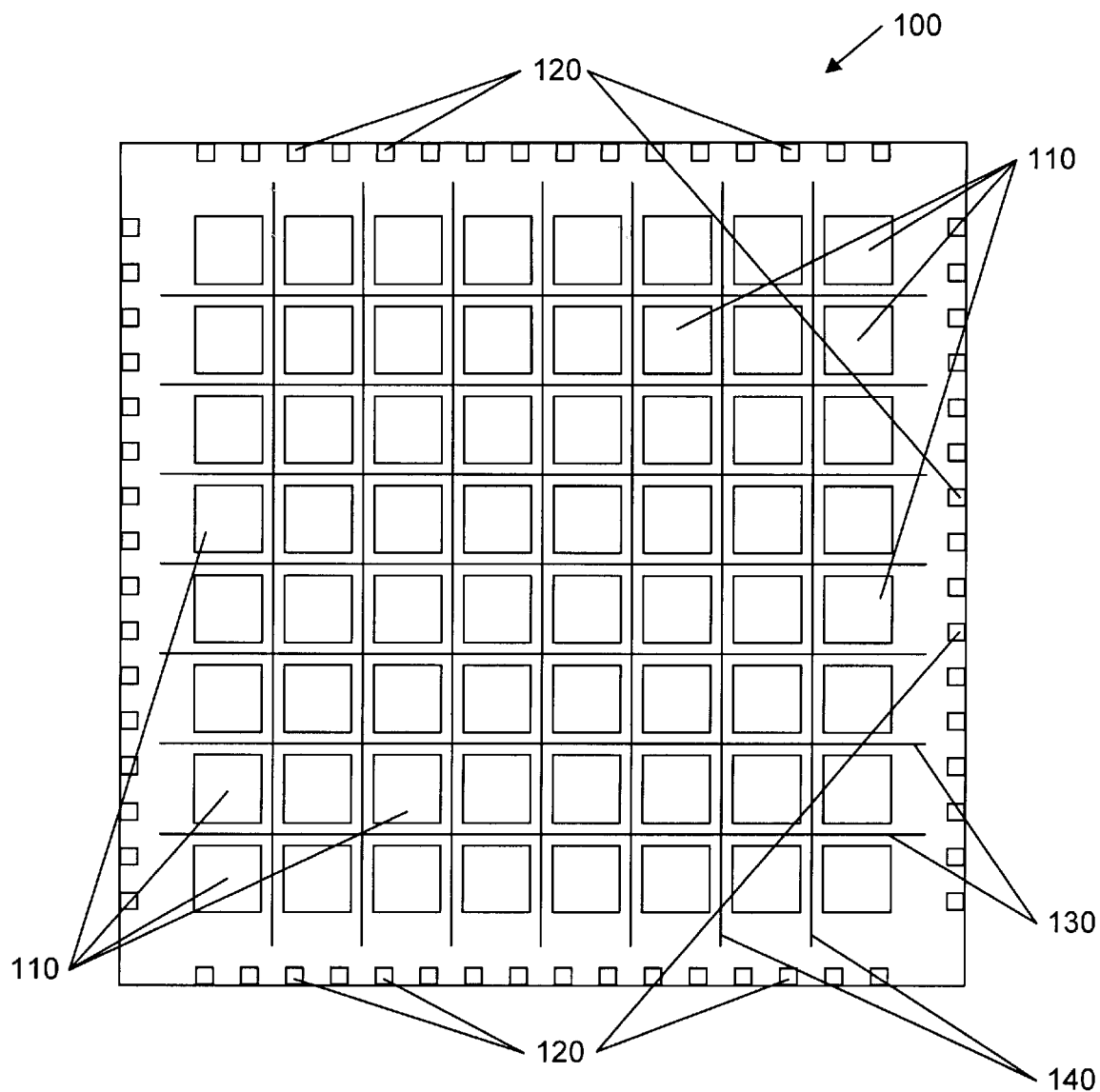
FIG. 1 is a block diagram of one type of conventional PLD, a field-programmable gate array 100.
Figure 2:
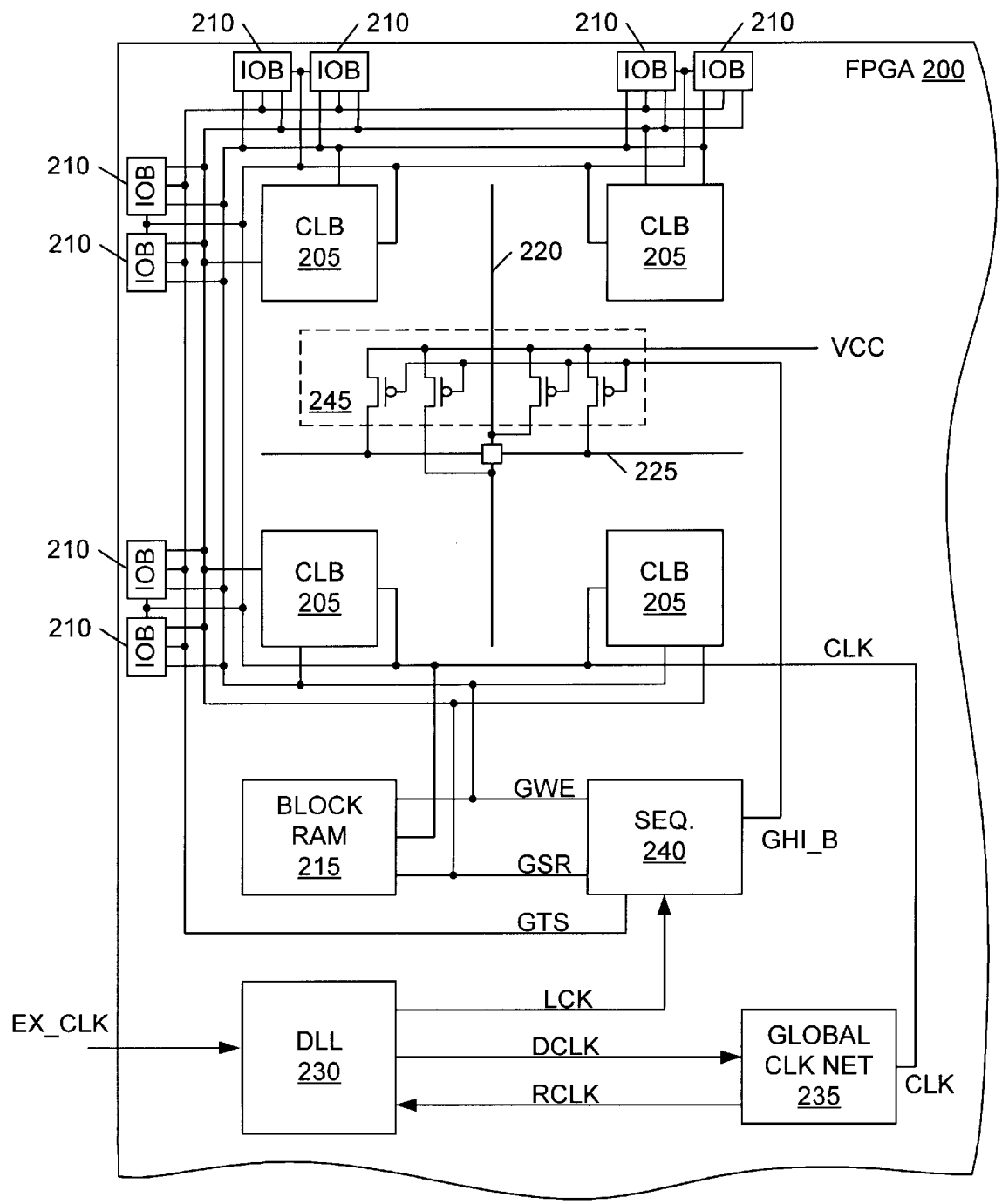
FIG. 2 schematically depicts a portion of an FPGA 200 in accordance with the invention.

FIG. 2 schematically depicts a portion of an FPGA 200 in accordance with the invention. FPGA 200 includes CLBs 205, IOBs 210, block RAM 215, and a complex programmable interconnect matrix represented by interconnect lines 220 and 225. These programmable elements function largely as discussed above in connection with FIG. 1, but are modified in accordance with the invention to include a delay-locked loop 230, a global clock network 235, and a sequencer 240. A set of PMOS transistors 245 selectively connects interconnect lines 225 and 220 to a supply voltage VCC, effectively disabling the interconnect.

Sequencer 240 controls the configuration process, including full and partial reconfiguration. Sequencer 240 connects to each CLB 205, IOB 210, and block RAM 215 via a global write-enable line GWE and a global set/reset line GSR. Each of lines GWE and GSR is connected to sequential memory elements within CLBs 205, IOBs 210, and block RAM 215. Global write-enable line GWE, when asserted, allows user data stored in CLBs 205, IOBs 210, and block RAM 215 to be overwritten with new data; negating (i.e., de-asserting) line GWE protects the user data. Global set/reset line GSR globally sets or resets each sequential memory element within FPGA 200. "Global" lines are those that broadcast signals throughout FPGA 200

Sequencer 240 connects to each transistor in set 245 via a global line GHI_B (the "B" is for "bar," and identifies the signal as an active low). When asserted (i.e., brought low), line GHI_B pulls each interconnect line 220 and 225 and each interconnect driver (not shown) to a logic one (hereafter referred to as "disabling the interconnect"). Sequencer 240 asserts the signal on line GHI_B during the configuration process to avoid data contention that might otherwise occur between interconnect lines.

The final global line from sequencer 240, the global tri-state line GTS, connects to each IOB 210. Sequencer 240 tri-states the output of each IOB 210 during configuration, effectively disconnecting FPGA 200 from input/output pads on FPGA 200 (see FIG. 4) to avoid data contention with circuitry external to FPGA 200.

DLL 230 is a delay-locked loop that synchronizes an external clock signal on a clock line EX_CLK with a reference clock signal on line RCLK from global clock network 235. DLL 230 connects to sequencer 240 via a lock line LCK and to global clock network 235 via a data-clock line DCLK. DLL 230 provides a lock signal on line LCK to signal sequencer 240 that the reference clock signal on line RCLK is locked in phase with an external clock on input line EX_CLK. Global clock network 235 is a buffered clock tree that distributes the data-clock signal on line DCLK to each CLB 205, IOB 210, and block RAM 215 via clock lines CLK and back to DLL 230 via line RCLK.

For purposes of the present invention, the term "delay-locked loop" is intended to encompass both delay-locked and phase-locked loops, both of which provide similar functionality. For a detailed discussion of an appropriate DLL and clock network for use in the present invention, see Joseph H. Hassoun, F. Erich Goetting, and John D. Logue, "Delay Lock Loop With Clock Phase Shifter," U.S. patent application Ser. No. 09/102,740, filed Jun. 22, 1998, and the Xilinx® Application note entitled "Using the Virtex Delay-Locked Loop," XAPP132 Oct. 21, 1988 (Version 1.31), which are incorporated herein by reference.

Figure 3:
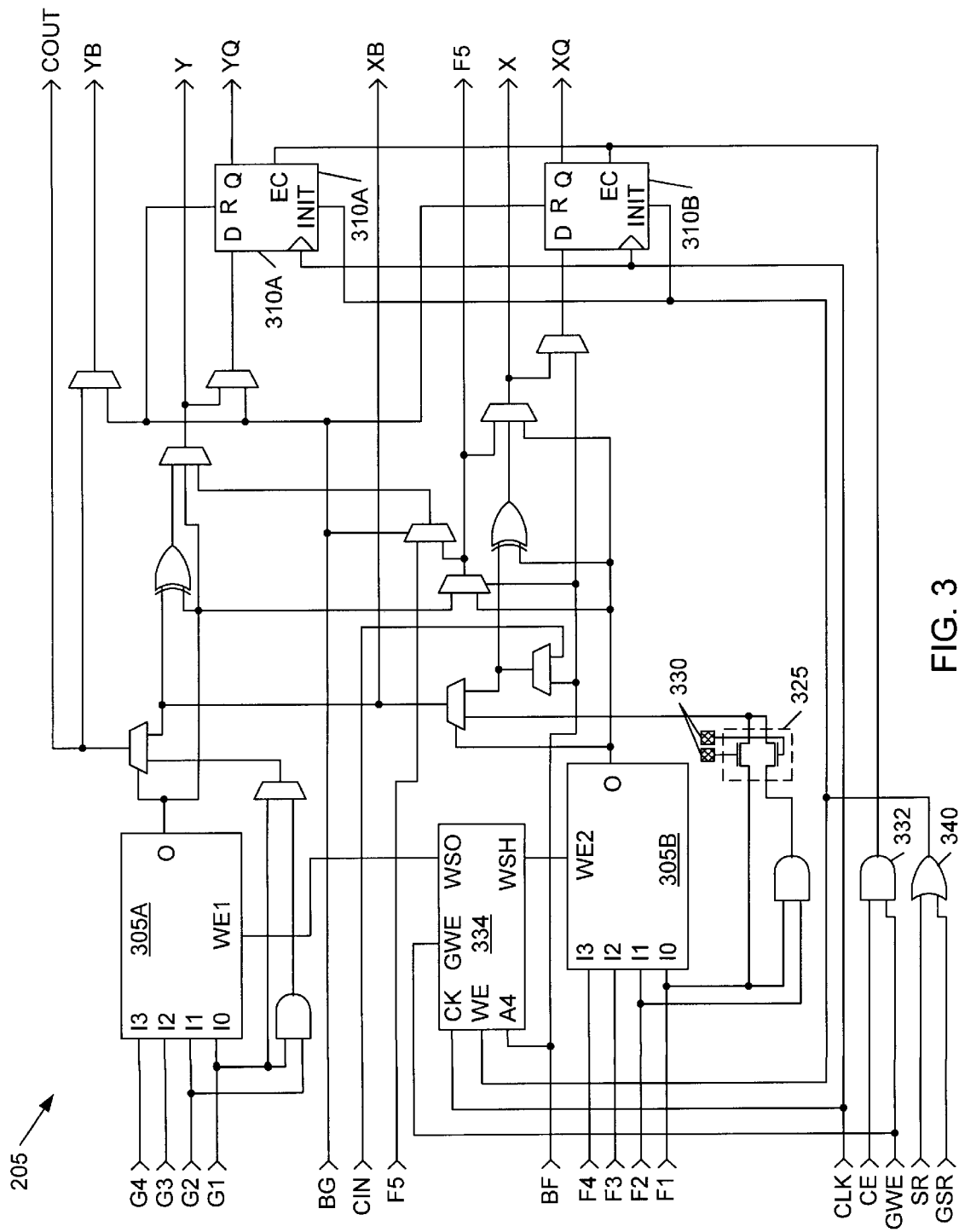
FIG. 3 is a schematic diagram of an exemplary CLB 205.

FIG. 3 is a schematic diagram of an exemplary CLB 205 similar to those of the Virtex™ family of devices available from Xilinx, Inc. All of the terminals to and from CLB 205 are connected to horizontal or vertical interconnect lines 220 and 225 (see FIG. 2) through which they can be programmably connected to various other components within FPGA 200.

CLB 205 includes two 4-input look-up tables (LUTs) 305A and 305B. LUTs 305A and 305B are each capable of implementing any arbitrarily defined Boolean function of up to four inputs. In addition, each of LUTs 305A and 305B can provide a 16×1-bit synchronous RAM. Furthermore, the two LUTs can be combined to create a 16×2-bit or 32×1-bit synchronous RAM, or a 16×1-bit dual-port synchronous RAM. When configured as RAM, LUTs 305A and 305B store user data.

CLB 205 also includes a pair of sequential storage elements 310A and 310B that can be configured either as edge-triggered D-type flip-flops or as level-sensitive latches. The D inputs can be driven either by LUTs 305A and 305B or directly from input terminals, bypassing LUTs 305A and 305B. Each storage element includes an initialization terminal INIT, a reverse-initialization terminal R, an enable-clock terminal EC, and a clock terminal conventionally designated using the symbol ">". The INIT terminal forces the associated storage element into an initialization state specified during configuration; the reverse-initialization terminal R forces the storage element in the opposite state as the INIT terminal. Terminals INIT and R can be configured to be synchronous or asynchronous, and all control inputs are independently invertible.

The functions of the various configurable elements of FPGA 200 are defined by configuration memory cells. An exemplary two-input multiplexer 325 includes a pair of MOS transistors having gate terminals connected to respective configuration memory cells 330. Other configuration memory cells used to define the functions of the remaining programmable elements of FPGA 200 are omitted for brevity. The use of configuration memory cells to define the function of programmable logic devices is well understood in the art.

A detailed discussion of CLB 205 is not necessary for understanding the present invention, and is therefore omitted for brevity. For a more detailed treatment of the operation of many components within CLB 205, see the co-pending U.S. patent applications Ser. No. 08/786,818 entitled "Configurable Logic Block with AND Gate for Efficient Multiplication in FPGAs," by Chapman et al., Ser. No. 08/754,421 entitled "Lookup Tables Which Double as Shift Registers," by Bauer, and U.S. Pat. No. 5,914,616, issued on Jun. 22, 1999, "FPGA Repeatable Interconnect Structure with Hierarchical Interconnect Lines," by Steven P. Young, et al. Each of the foregoing documents is incorporated herein by reference.

In accordance with the invention, global write-enable line GWE connects through an AND gate 332 to storage elements 310A and 310B. Global write-enable line GWE, when asserted, allows user data stored in storage elements 310A and 310B, as well as similar flip-flops in other CLBs, to be overwritten with new data. Write-enable line GWE also connects to the write-enable terminals WE of LUTs 305A and 305B through some write-strobe logic 334. Write-strobe logic 334 handles writing to memory in LUTs 305A and 305B, and is discussed in detail in the above-incorporated application entitled "FPGA Repeatable Interconnect Structure with Hierarchical Interconnect Lines." Write-strobe logic 334 allows the global write-enable signal on line GWE to protect data within LUTs 305A and 305B when LUTs 305A and 305B are configured as user memory. Whether flip-flops 310A and 310B are write enabled can also be locally controlled by a control line CE, provided control line GWE is already asserted.

Set/reset line SR and global set/reset line GSR connect through an OR gate 340 to the initialization terminal INIT of storage elements 310A and 310B. As discussed above, each initialization terminal INIT forces the associated storage elements into an initialization state specified during configuration. Thus, the initialization states of storage elements 310A and 310B can be locally controlled using control line SR or can be globally controlled using global set/reset line GSR.

Set/reset line SR and global set/reset line GSR also connect through OR gate 340 and write-enable logic 334 to the respective write-enable terminals WE1 and WE2 of LUTs 305A and 305B. Set/reset lines SR and GSR can therefore be used either as write-enable control lines for LUTs 305A and 305B when those elements are configured as RAM, or, as mentioned above, can be used as set/reset control lines for storage elements 310A and 310B.

Figure 4:
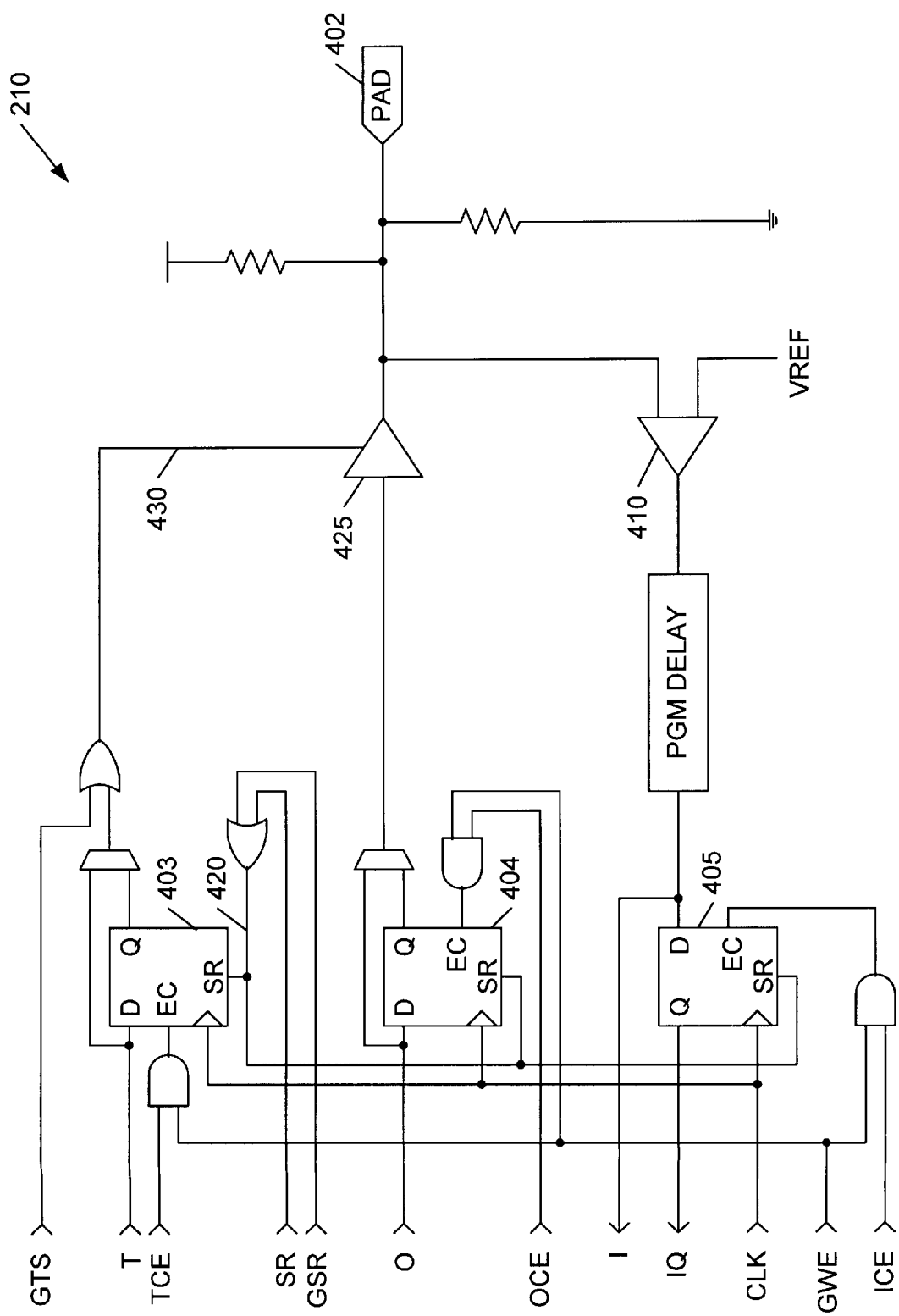
FIG. 4 depicts an exemplary IOB 210.

FIG. 4 depicts an exemplary IOB 210 similar to those of the Virtex™ family of devices available from Xilinx, Inc. IOB 210 provides the interface between an external package pad 402 and some internal logic via interconnect lines 220 and 225 (FIG. 2). IOB 210 can be configured for input, output, or bidirectional signals. When configured as an input block, IOB 210 conveys input signals into internal circuitry of FPGA 200 from I/O pad 402 through an input buffer 410. When IOB 210 is configured as an output block, IOB 210 conveys output signals from internal circuitry (e.g., CLBs 205) to I/O pad 402 through output buffer 425. A more complete discussion of IOB 210 can be found in Xilinx, Inc., *Virtex Data Sheet, Xcell*, Issue 31, First Quarter 1999, at pp. 41–53, which is incorporated herein by reference.

IOB 210 includes three sequential storage elements 403, 404, and 405. Each storage element includes an enable-clock input EC, and a set/reset input SR. The various programmable elements depicted in FIG. 4 are controlled by configuration memory cells (not shown) similar to memory cells 330 of FIG. 3.

A local set/reset line SR controls the logic level on set/reset line 420, and therefore sets and resets storage elements 403, 404, and 405. Storage elements 403, 404, and 405 (and the similar storage elements in the other IOBs and CLBs) can also be globally set or reset. Thus, storage elements 403, 404, and 405 can be reset by either a local set/reset signal on line SR or a global set/reset signal on global set/reset line GSR.

Output buffer 425 can be tri-stated by providing a signal on a line 430. Output buffer 425 can be tri-stated individually by asserting local tri-state line T, or all of IOBs 210 of FIG. 2 can be globally tri-stated using line global tri-state line GTS.

Figure 5:
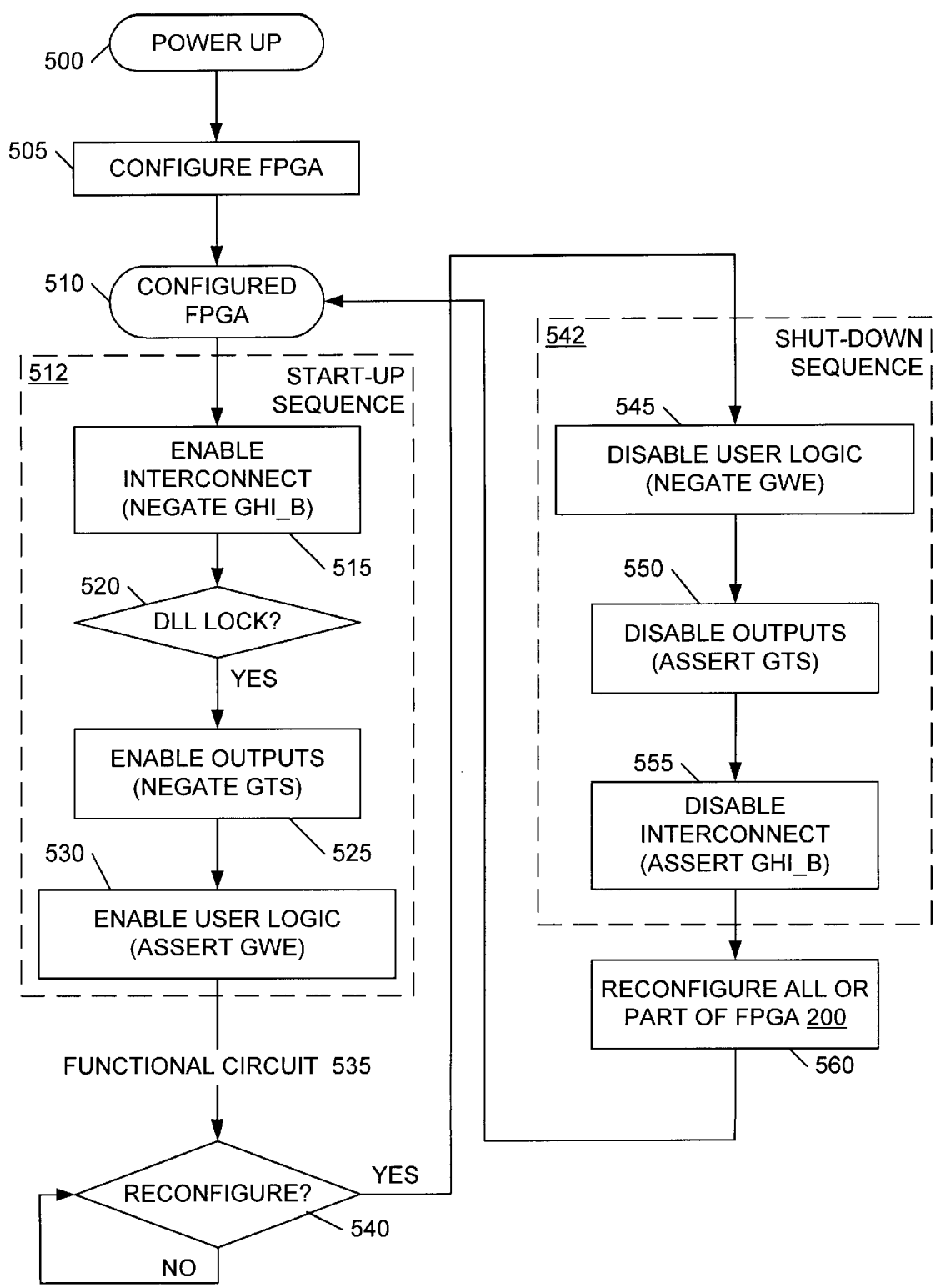
FIG. 5 is a flow chart illustrating the operation of sequencer 240 of FIG. 2.

FIG. 5 is a flow chart illustrating the operation of sequencer 240 of FIG. 2. The process begins at step 500, when FPGA 200 is powered up. After power up, global write-enable signal GWE is negated to disable user storage, global tri-state signal GTS is asserted to isolate IOBs 210 from external circuitry, and signal GHI_B is asserted to disable interconnect lines 220 and 225 (e.g., pulling the signal on these lines to a logic one). Next, in step 505, FPGA 200 is configured, which is to say that the configuration memory cells within FPGA 200 are programmed to define some desired logical function. The process of configuring an FPGA to perform a logical function is well understood to those of skill in the art.

Once configured, FPGA 200 steps through a start-up sequence 512. The first step of start-up sequence 512 (step 515) is to enable interconnect lines 220 and 225 by negating the low signal on line GHI_B. (As mentioned previously, the signal on line GHI_B is asserted (pulled to a logic zero) during configuration to avoid data conflicts between functional elements (e.g., CLBs and IOBs) of FPGA 200.) Sequencer 240 then waits for a "lock" signal (step 520) on line LCK from DLL 230. DLL 230 asserts the lock signal after the external clock signal on line EX_CLK is synchronized with the reference clock signal on line RCLK from global clock network 235. This synchronization is necessary to ensure that the various components of FPGA 200 are receiving reliable clock signals before those components are activated.

Next, in step 525, sequencer 240 negates global tri-state signal GTS, thereby enabling IOBs 210 to communicate with devices external to FPGA 200. Sequencer 240 then asserts global write-enable signal GWE (step 530), which allows the FPGA 200 to write to user logic (e.g., storage elements 310A and 310B of FIG. 3). Sequencer 240 also negates the global set/reset signal GSR in step 530 to release each sequential storage element in FPGA 200 from a preset state. Upon completion of step 530, FPGA 200 is a fully functional logic circuit 535.

FPGA 200 remains operational as logic circuit 535 until FPGA 200 is powered off, reset, or receives a reconfiguration command. If powered off, FPGA 200 may be powered up and reconfigured (steps 500 and 505), and thereby return to step 510. A system reset similarly returns FPGA 200 to step 510. In accordance with the invention, FPGA 200 can also be fully or partially reconfigured without completely powering off or resetting FPGA 200, thus reducing the time required for reconfiguration. This reconfiguration process begins at step 540.

FPGA 200 enters a shut-down sequence 542 upon receipt of a reconfiguration command. Shut-down sequence 542 preserves selected user data and protects various elements within FPGA 200 from data contention. Shut-down sequence 542 also readies FPGA 200 to receive new configuration data and/or new user data.

Shut-down sequence 542 begins at step 545, in which sequencer 240 disables user logic (e.g., storage elements 310A and 310B of FIG. 3 and storage elements 403, 404, and 405 of FIG. 4) by negating the global write-enable signal GWE. This operation preserves any user data derived during previous logical operations by disabling the clock terminals of the user logic. The signal on line GSR is not asserted if user data is to be preserved through the reconfiguration process.

Next, to avoid IOB data contention, each IOB 210 is tri-stated by asserting the global tri-state signal GTS (step 550). Finally, in step 555, all of interconnect lines 220 and 225 are disabled by asserting GHI_B to avoid data contention between FPGA components.

The shut-down sequence places FPGA 200 in a "safe" mode that allows all or a portion of FPGA 200 to be reconfigured without instigating potentially destructive data contentions between circuits within or external to FPGA 200. FPGA 200 is then either wholly or partially reconfigured (step 560), thereby returning the process of FIG. 5 to step 510. FPGA 200 is conventionally configured or reconfigured using a series of frames of configuration data. FPGA 200 may be fully or partially reconfigured by writing over one or more frames of configuration data. The ability to reconfigure FPGA 200 without powering down or resetting the device saves valuable time, particularly when only a portion of FPGA 200 need be reconfigured.

Once reconfigured, FPGA 200 once again traverses the steps of start-up sequence 512. Step 515 enables interconnect lines 220 and 225 by negating the low signal on line GHI_B. The process generally passes through step 520 quickly, as DLL 230 should remain locked from the initial start-up sequence, and will therefore continue to assert the lock signal. Eliminating the need to wait for DLL 230 to lock saves time over conventional reconfiguration methods.

Next, in step 525, sequencer 240 negates global tri-state signal GTS, enabling IOBs 210 to communicate with external circuitry. Sequencer 240 then asserts global write-enable signal GWE (step 530). If GSR was asserted in shut-down, sequencer 240 may also negate the global set/reset signal GSR in step 530 to release from preset each sequential storage element in FPGA 200. Upon completion of start-up sequence 512, FPGA 200 is once again functional, this time performing the new logic function specified during the full or partial reconfiguration.

While the present invention has been described in connection with specific embodiments, variations of these embodiments will be obvious to those of ordinary skill in the art. For example, the various global signals might be grouped into regional signals that control subsets of the programmable logic on a given FPGA. In one embodiment, FPGA resources are divided into two regions, each controlled by separate sets of regional signals. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A programmable logic device comprising:
   a. a plurality of configurable logic blocks, each having a logic-block clock terminal;
   b. a programmable interconnect matrix adapted to selectively interconnect ones of the configurable logic blocks;
   c. a delay-locked loop having:
      i. a clock-input terminal;
      ii. a clock-output terminal adapted to provide a clock signal; and
      iii. a lock-signal output terminal;
   d. a sequencer having a sequencer input terminal connected to the lock-signal output terminal and a sequencer output terminal connected to each of the configurable logic blocks; and
   e. a clock-distribution network having an input terminal connected to the clock-output terminal and a plurality of distributed clock terminals connected to respective ones of the logic-block clock terminals, the network adapted to distribute the clock signal to the plurality of configurable logic blocks.

2. The programmable logic device of claim 1, wherein the clock-distribution network further comprises a return clock terminal connected to the delay-locked loop.

3. The programmable logic device of claim 1, further comprising a global clock terminal connected to the clock input terminal of the delay-locked loop.

4. The programmable logic device of claim 3, wherein the global clock terminal comprises an input pin of the programmable logic device adapted to receive an external clock.

5. The programmable logic device of claim 1, wherein the sequencer controls a process of configuring the programmable logic device to perform a specified logic function.

6. A method of preparing a programmable logic device to perform a desired logic function, the programmable logic device including a delay-locked loop, an array of configurable logic blocks that are programmably interconnected to each other and to programmable input/output blocks using a programmable interconnect matrix, the method comprising:
   a. providing a clock signal on a clock input terminal of the delay-locked loop;
   b. monitoring a lock terminal of the delay-locked loop for a lock signal;
   c. writing a set of configuration data into a plurality of configuration memory cells that collectively define the function and interconnection of the configurable logic blocks, interconnect matrix, and input/output blocks; and
   d. upon completion of (c), awaiting the lock signal before enabling the input/output blocks.

7. The method of claim 6, further comprising disabling the interconnect matrix while writing configuration data.

8. The method of claim 7, further comprising enabling the interconnect matrix.

9. The method of claim 6, further comprising writing a second set of configuration data into the plurality of configuration memory cells.

10. The method of claim 6, further comprising maintaining the lock signal while the second set of configuration data is written.

11. The method of claim 10, further comprising activating the programmable logic device after writing the second set of configuration memory cells without waiting for a second lock signal.

12. A programmable logic device comprising:
   a. means for synchronizing a first clock signal with a reference clock signal, wherein the synchronizing means produces a lock signal indicating that the first and reference clock signals are in phase; and
   b. a sequencer having:
      i. a sequencer input terminal adapted to receive the lock signal, wherein the sequencer is adapted to carry out a sequence of configuration steps that program the programmable logic device to perform a selected circuit operation; and
      ii. means for maintaining the programmable logic device in an inactive state until the sequencer receives the lock signal.

13. The programmable logic device of claim 12, further comprising means for reconfiguring the programmable logic device while maintaining the lock signal.

\* \* \* \* \*